United States Patent [19]

Dong

[11] Patent Number: 5,268,655
[45] Date of Patent: Dec. 7, 1993

[54] DEVICE AND METHOD FOR AUTOMATICALLY ADJUSTING A PHASE-LOCKED LOOP

[75] Inventor: Ping Dong, No. Quincy, Mass.

[73] Assignee: Codex Corporation, Mansfield, Mass.

[21] Appl. No.: 890,043

[22] Filed: May 27, 1992

[51] Int. Cl.⁵ .......................................... H03L 7/093
[52] U.S. Cl. ...................................... 331/16; 331/17; 331/25
[58] Field of Search ...................... 331/1 A, 17, 16, 25

[56]      References Cited
       U.S. PATENT DOCUMENTS

| | | | |
|---|---|---|---|
| 3,983,498 | 9/1976 | Malek | 328/155 |
| 4,107,624 | 8/1978 | Turner | 331/17 X |
| 4,117,410 | 9/1978 | Bender | 329/326 |
| 4,117,420 | 9/1978 | DeConinck et al. | 331/17 |
| 4,479,091 | 10/1984 | Yoshisato | 331/17 X |
| 4,668,917 | 5/1987 | Levine | 328/133 |
| 4,672,632 | 6/1987 | Andersen | 375/57 |

Primary Examiner—Siegfried H. Grimm
Attorney, Agent, or Firm—Darleen J. Stockley

[57] ABSTRACT

A self-adjusting phase-locked loop (PLL) parameter adjusting device (APAD) (100) and method that automatically adjusts a phase-locked loop to provide tracking ability when and where needed, as opposed to utilizing a PLL adjusting device with preset parameters, thus maintaining minimal possible noise bandwidth. The method utilizes (1) successively integrating the PLL error output signal over a number of samples to provide a plurality of sums, (2) checking a predetermined number of sums and recording and counting the sign of each sum, (3) comparing the counted record to a predetermined threshold value, and (4) automatically adjusting PLL parameter(s) and the sample number in accordance with a predetermined strategy, such that adjusted PLL parameters are provided to the PLL.

20 Claims, 4 Drawing Sheets

DEVICE AND METHOD FOR AUTOMATICALLY ADJUSTING A PHASE-LOCKED LOOP

FIELD OF THE INVENTION

This invention relates generally to phase-locked loops, and more particularly to reduced noise bandwidth phase-locked loops.

BACKGROUND OF THE INVENTION

Phase-locked loops (PLLs) are typically used to provide frequency selectivity for demodulation of frequency modulated (FM) signals in numerous communications equipment such as satellite communications equipment, stereo receivers, FM radios, stereos, and modems. A PLL is characterized by its ability to track a varying input frequency signal and as a signal conditioner. Since the PLL locks onto only the desired frequency component of the input signal, typically a voltage-controlled oscillator in the PLL reproduces the input signal at the same frequency, but without noise and interference.

A good phase-locked loop should have a fast tracking speed to track possible signal phase change and a small noise bandwidth to reduce output phase jitter. However, the fast tracking speed and small noise bandwidth requirements are conflicting. That is, for a given set of phase-lock loop parameters, a fast tracking speed will mean a larger noise bandwidth, while a smaller noise bandwidth will necessarily reduce tracking ability.

Traditionally, in high speed modems, gear-shifting is used to change PLL parameters at different stages of operation. For example, in a training stage, a set of parameters corresponding to fast tracking is used to ensure proper tracking, and in steady state operation, another set of parameters corresponding to a selected small noise bandwidth is used to reduce phase jitter. Frequently, multiple gear-shifting stages are required to ensure proper operation.

An inherent disadvantage of the above approach is that the PLL parameters have to be set to accommodate a worst case tracking requirement specified in a modem design, unduly increasing the output phase jitter. While the worst case seldom occurs, the increased noise bandwidth is always being experienced. A second disadvantage is the PLL's poor ability to adapt to changing operating conditions, such as sudden timing source or carrier phase changes. To be able to recover from a sudden change, the PLL has to operate in a mode faster than necessary for normal operation, again unduly increasing phase jitter.

As the data rate for modems has increased, toleration of phase jitter has decreased. The phase jitter increase due to the worst case tracking requirement in conventional PLLs has created a data transmission speed limitation for modems. There is a need for a PLL that can self-adjust, providing tracking ability when and where needed, while maintaining minimal possible noise bandwidth.

SUMMARY OF THE INVENTION

The invention features an automatic phase-locked loop (PLL) parameter adjusting device (APAD) and a method for automatically adjusting PLL parameters. The APAD has a PLL error signal input and comprises an integrating unit, a counting unit, a threshold unit, and an automatic decision unit. The integrating unit (I) has an I input and an I output. The I input is operably coupled to receive the PLL error signal. The integrating unit successively integrates the PLL error for a predetermined N sample interval and provides a sum signal at the I output, where N is a first preselected integer. The integrating unit is further operably coupled to receive an output signal from the automatic decision unit, and adjusts N in correspondence with said output signal. The counting unit (C) has a C input and a C output, the C input being operably coupled to receive the I output signal. The counting unit counts K sum signals (where K is a second preselected integer) and records and counts the sign of said signals to provide a counter comparator signal at the C output. The threshold unit (TH) has a TH input and a TH output, the TH input being operably coupled to receive the C output (counter comparator) signal. The threshold unit compares the C output (counter comparator) signal with a predetermined threshold value to provide a parameter modification signal at the TH output. The automatic decision means (AD) has an AD input and at least first and second AD outputs, the AD input being operably coupled to receive the TH output signal. The AD unit provides a signal to the integrating unit, causing adjustment of N (incrementing/decrementing N) in accordance with a predetermined strategy, and adjusts PLL parameter(s) in accordance with the predetermined strategy, providing AD output signal(s) that represent(s) the adjusted PLL parameter(s), being at least a second AD output signal, to the PLL.

The method of the present invention for automatically adjusting parameters of a phase-locked loop (PLL) that has a PLL error output signal, comprises the steps of: (1) successively integrating the PLL error output signal over N samples to provide a sum, where N is a first preselected integer, to provide a plurality of sums, (2) checking K sums, where K is a second preselected integer, and recording and counting the sign of each sum, (3) comparing the counted record to a predetermined threshold value, and (4) automatically adjusting PLL parameter(s) and N in accordance with a predetermined strategy, such that adjusted PLL parameters are provided to the PLL.

DETAILED DESCRIPTION OF A PREFERRED EMBODIMENT

The present invention, an automatic phase-locked loop (PLL) parameter adjusting device (APAD), adjusts its PLL as needed, providing necessary tracking speed while maintaining minimal possible noise bandwidth.

Figure 1:
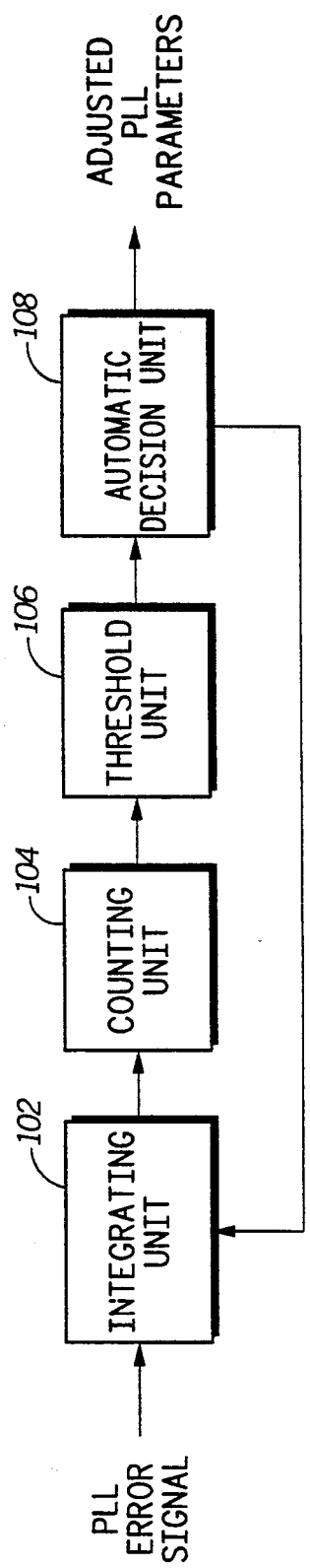
FIG. 1 is a block diagram of an automatic phase locked-loop (PLL) parameter adjusting device in accordance with the present invention.

FIG. 1, numeral 100, is a block diagram of an automatic phase locked-loop (PLL) parameter adjusting device (APAD) in accordance with the present invention. The APAD comprises an integrating unit (102), a counting unit (104), a threshold unit (106) and an automatic decision unit (108). The integrating unit (I) (102) has an I input and an I output. The I input is operably coupled to receive a PLL error signal from a selected PLL. I (102) integrates the PLL error signal over a predetermined number of samples (N), providing a sum signal at the I output. Thus, the sum signal represents a signed sum of samples of the PLL error signal over an N sample interval. N is a first preselected integer that is selectable according to a particular application, and typically represents a selected number of samples to be summed.

The counting unit (C) (104) has a C input and a C output. The C input is operably coupled to receive the I output (sum) signal. C counts K sum signals (where K is a second preselected integer), recording and counting the sign of said signals to provide a counter comparator signal at the C output.

The threshold unit (TH) (106) has a TH input and a TH output. The TH input is operably coupled to receive the C output (counter comparator) signal. TH (106) compares the C output (counter comparator) signal with a predetermined threshold value and provides a parameter modification signal at the TH output.

The automatic decision unit (AD) (108) has an AD input and at least first and second AD outputs. The AD input is operably coupled to receive the TH output signal. The AD (108) utilizes a predetermined strategy, described more fully below, to determine whether to increment or decrement N. The AD (108) further adjusts PLL parameter(s) in accordance with the strategy. The AD (108) provides a first AD output signal to the integrating unit (102), causing adjustment of N (incrementing/decrementing N) and provides AD output signal(s) to the PLL that represent(s) the adjusted PLL parameter(s), being at least a second AD output signal.

The predetermined strategy of the AD (108) typically provides for adjusting N and PLL parameter(s) in accordance with the parameter modification signal received from the TH (106). Where the counter comparator signal is greater than or equal to a predetermined threshold value (and where N is greater than a preselected minimum value), the TH (106), typically a hard-limiting limiter circuit, provides a parameter modification signal that causes the AD to provide an output AD signal to the integrating unit (102) that causes N to be decremented by 1/c times a range of N (where a range of N is generally determined by a hardware implementation), where c is a predetermined value. Where N is already at the preselected minimum value, the value of N remains unchanged. Further, the AD (108) adjusts the PLL parameter(s) by a increment step and provides the adjusted PLL parameter value(s) to the PLL, thereby causing the PLL to provide an accelerated PLL tracking speed. The range of PLL parameter adjustment and the maximum and minimum values for N are typically determined by a specification and hardware design of a system utilizing the APAD.

The predetermined strategy further provides that, where the counter comparator signal is less than the predetermined threshold value (and where N is less than a preselected minimum value), the TH (106) provides a parameter modification signal that causes the AD to provide an output AD signal to the integrating unit (102), causing N to be incremented by 1/d times the range of N, where d is a predetermined value. Where N is already at the preselected maximum value, the value of N remains unchanged. Further, the AD (108) adjusts the PLL parameter(s) by a decrement step and provides the adjusted PLL parameter value(s) to the PLL, thereby causing the PLL to provide a decelerated PLL tracking speed.

Where two PLL parameters are to be adjusted for a second order PLL, the AD (108) typically further includes an incrementing unit (not shown) for incrementing the first PLL parameter by (1/a) times a PLL parameter range to provide an adjusted first parameter. Clearly, a value for "1/a" is preset, and the incrementing unit includes multiplication means and summing means. The AD (108) also includes a decrementing unit (not shown) for decrementing the first PLL parameter by (1/b) times the PLL parameter range to provide an adjusted first parameter. Thus, a value for "1/b" is preset, and the decrementing unit includes multiplication means and summing means. "a" and "b" are first and second preselected values that typically depend upon the specification and hardware design of the system employed. "a" and "b" may be selected to be different values, thus providing a tracking speed acceleration rate that is different from the tracking speed deceleration rate. The AD (108) further includes, for adjusting the second PLL parameter, a squaring unit (not shown) for squaring the value of the adjusted first PLL parameter and a dividing unit (not shown) for dividing the squared value by a third preselected value to provide the adjusted second PLL parameter. In one embodiment, the incrementing unit, the decrementing unit, the squaring unit, and the dividing unit may be implemented within an arithmetic logic unit.

Figure 2:
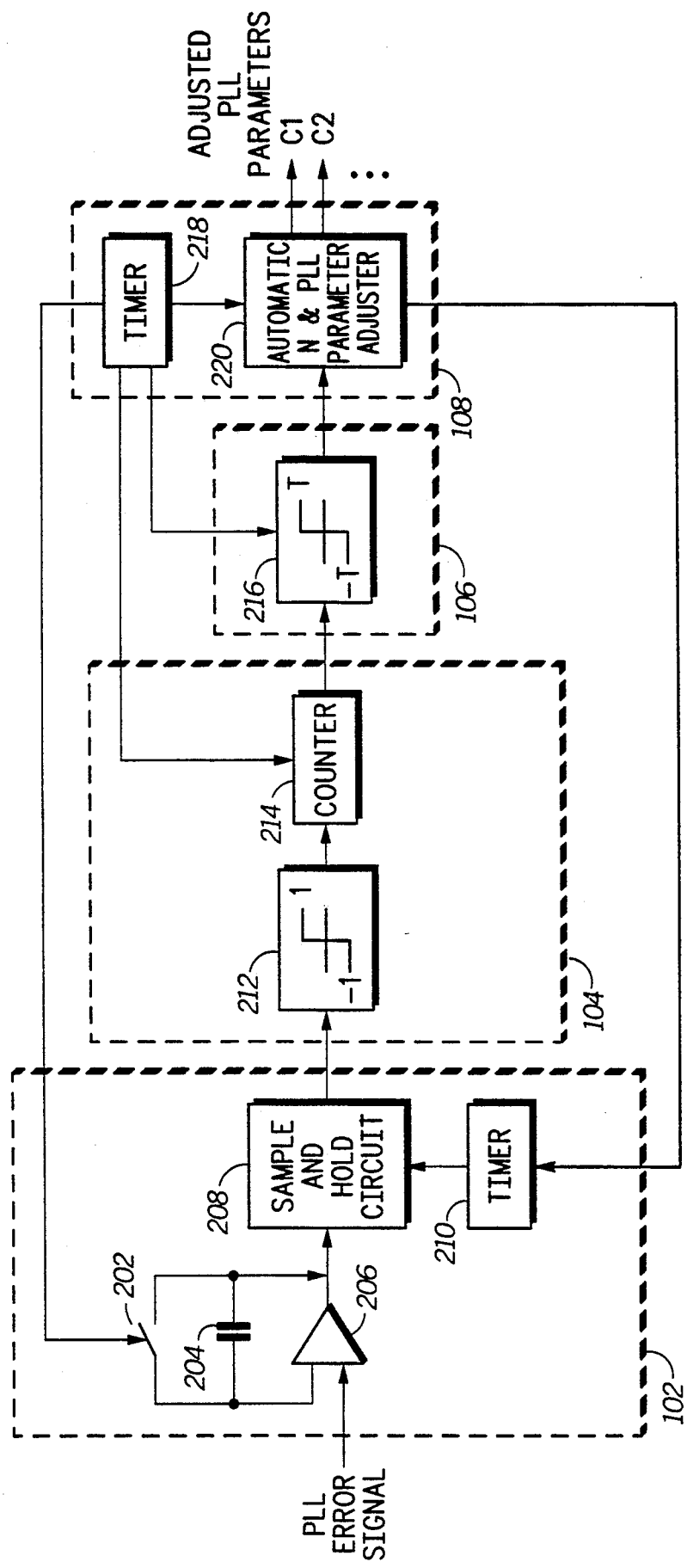
FIG. 2 is a block diagram of a first embodiment of an automatic PLL parameter adjusting device in accordance with the present invention.

FIG. 2, numeral 200, is a block diagram of a first embodiment of an automatic PLL parameter adjusting device in accordance with the present invention wherein the integrating unit (102) comprises a predetermined op-amp (206), operably coupled to receive the PLL error signal, having a switch (202) and a predetermined capacitor (204) coupled in parallel to an input and an output of the op-amp (206), a sample and hold circuit (208), and a timer (210). The switch (202) is further coupled to the AD (108) for synchronizing the integrating unit operation with the operation of the AD (108). The output of the op-amp (206) is further coupled to the sample and hold circuit (208). A first timer (210) is coupled to the sample and hold circuit (208), and receives an output signal from the AD that causes the first timer (210) to increment/decrement N in response thereto. Thus, the sample and hold circuit provides the I output signal utilizing the adjusted N.

In this embodiment, the counting unit (104) comprises a hard-limiting limiter circuit (212) and a counter (214). The hard-limiting limiter circuit (212) is operably coupled to receive the I output signal, and provides a limiter output signal, for example, 1/−1, to the counter. Thus, for K sum signals where K=8, for example, the counter will provide a counter comparator signal having a magnitude and sign from −8 to +8. Clearly, the limiter circuit may be selected to provide other values. The counter (214) is operably coupled to a timer (218) of the AD (108), such that the counter (214) provides a C output signal after every K events. K is a preset integer value that is independent of N. An event is receiving a summed signal for N samples.

The APAD may be selected to further include a phase locked-loop (PLL), operably coupled to receive an input signal, where the PLL provides the PLL error signal and utilizes the AD output signal(s) that represent(s) the adjusted PLL parameter(s) to adjust a PLL output signal to track the input signal.

In the first embodiment, shown in FIG. 2, the threshold unit (106) is a hard-limiting limiter circuit (216), operably coupled to receive the C output signal. The limiter circuit (216) uses a predetermined threshold value, ±T, for comparison with the counter comparison signal. T is selectable, and typically depends on an implementation and hardware utilized. For K=8, for example, the threshold value may be chosen to be ±8 (i.e., all signal events have a same sign). In this embodiment, the AD (108) includes a second timer (218) and an automatic N and PLL parameter adjuster (220). The second timer (218) is operably coupled to the switch (202) of the integrating unit (102), to the counter (214) of the counting unit (104), the hard-limiting limiter circuit (216) of threshold unit (106), and to the automatic N and PLL parameter adjuster (220), to synchronize timing. Thus, the automatic N and PLL parameter adjuster (220) is coupled to receive an input signal from the second timer (218) for synchronizing, as preselected, timing of its output signals with the integrating unit (102) output signals, and adjusts predetermined PLL parameters in correspondence with the predetermined strategy to provide adjusted PLL parameters (C1, C2). The adjuster (220) also provides an output signal to the first timer (210) of the integrating unit (102) to cause N to be incremented/decremented in accordance with the predetermined strategy.

Figure 3:
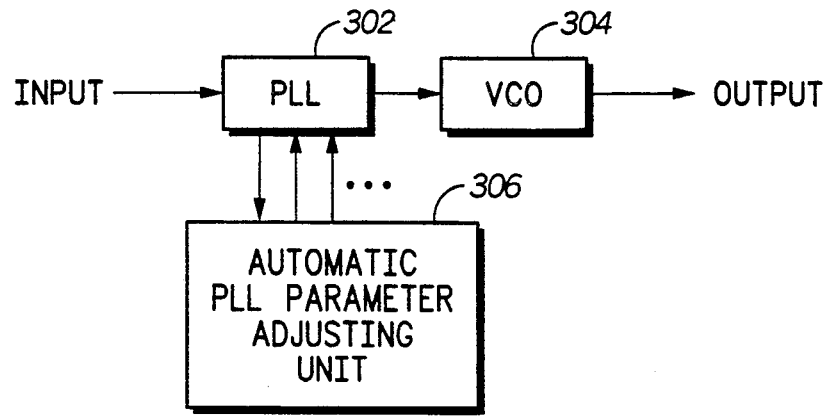
FIG. 3 is a block diagram of a system for regulating a voltage-controlled oscillator with an automatically adjusted phase-locked loop (PLL) in accordance with the present invention.

FIG. 3, numeral 300, is a block diagram of a system for regulating a voltage-controlled oscillator with a phase-locked loop (PLL) that is automatically adjusted in accordance with the present invention. The system includes a phase-locked loop (PLL) (302), an automatic PLL parameter adjusting unit (306), and a voltage-controlled oscillator (304). The PLL (302) has at least first and second PLL inputs and at least first and second PLL outputs. The PLL (302) is operably coupled to receive the input signal at the first PLL input, and provides a PLL error signal to the automatic PLL parameter adjusting unit (306) as a first PLL output signal. The PLL (302) receives and utilizes adjusted PLL parameter(s) from the automatic PLL parameter adjusting unit (306) to provide an adjusted PLL signal to a voltage-controlled oscillator unit (VCO) (304) at the second PLL output. The automatic PLL parameter adjusting unit (APA) (306) typically has predetermined PLL parameters and has a first APA input and at least a first APA output. The APA (306) is operably coupled to receive the PLL error signal at the first APA input, and automatically adjusts the predetermined PLL parameters in accordance with a predetermined strategy (described more fully above). The APA (306) provides signal(s) representing the adjusted PLL parameter(s) at APA output(s) that are operably coupled to provide signal(s) representing adjusted PLL parameters at PLL input(s). The voltage-controlled oscillator unit (VCO) (304) has at least a first VCO input and a first VCO output. The VCO (304) is operably coupled to receive the adjusted PLL signal at the first VCO input, and tunes the VCO in accordance with a predetermined scheme to provide the first VCO output signal. Typically, for example, where the adjusted PLL signal increases by a first predetermined value, the predetermined scheme for the VCO (304) may adjust the VCO to provide a signal having a frequency increased by a second predetermined value as the first VCO output signal.

Figure 4:
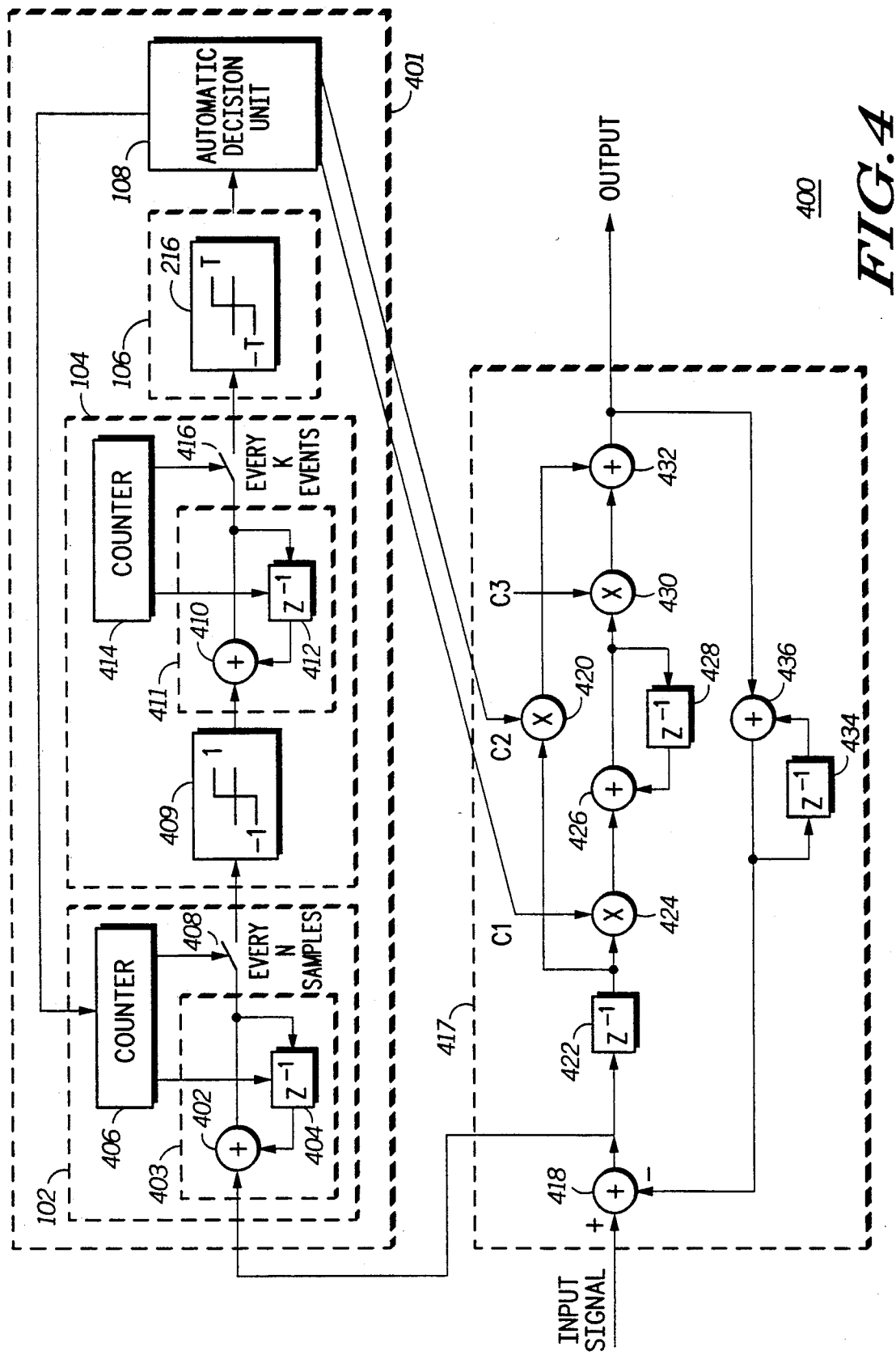
FIG. 4, numeral 400, is a block diagram of an exemplary implementation of an automatic PLL parameter adjusting device, operably coupled to provide adjusted PLL parameters to a second order PLL in accordance with the present invention, the PLL having two adjustable parameters.

FIG. 4, numeral 400, is a block diagram of an exemplary implementation of an automatic PLL parameter adjusting device (401), operably coupled to provide adjusted PLL parameters to a second order PLL (417) in accordance with the present invention, the PLL having two adjustable parameters (C1, C2). In this embodiment the integrating unit (102) is operably coupled to receive the PLL error signal and comprises a first integrator (403), a first counter (405), and a first switch (408). The first integrator (403) comprises a first summer (402), coupled to receive the PLL error signal, and a first delay unit (404) that receives an input signal from an output of the first summer (402) and from the first counter (406) for providing a delayed first summer signal to the first summer (402). The first counter (406) is operably coupled to an automatic decision unit (AD) (108), to the first delay unit (404), and to the first switch (408). The first counter (406) causes the first switch (408) to close after every N samples are summed to provide an integrating unit (102) (I) output signal and increments/decrements N in accordance with an output signal from the AD and clear the delay unit (404). The counting unit (104) comprises a hard-limiting limiter circuit (409), a second integrator (411), a second counter (414) and a switch (416). The hard-limiting limiter circuit (409) is operably coupled to receive the I output signal, and provides a limiter output signal to the second integrator (411) such as, for example, +1/−1. The second integrator (411) comprises a second summer (410), operably coupled to receive the hard-limiting limiter circuit (409) output signal, and a second delay unit (412) that receives input from an output of the second summer (410) and from the second counter (414) for providing a delayed second summer output signal to the second summer (410). The second counter (414) is operably coupled to the second delay unit (412) and to the second switch (416) such that the second counter (414) causes the second switch (416) to close after every K events to provide the C output signal and clear the delay unit (412). The threshold unit (TH) (106) is a hard-limiting limiter circuit (216), operably coupled to receive the C output signal, that compares a predetermined threshold value, ±T, with the counter comparison signal, providing an output TH signal. The automatic decision unit (AD) (108) is coupled to receive the TH output signal, and adjusts predetermined PLL parameters in correspondence with the predetermined strategy to provide adjusted PLL parameters (C1, C2) and provides the adjusted C1 and C2 to the second order PLL. The AD (108) also provides an output signal to the first counter (406) of the integrating unit (102) to cause N to be incremented/decremented in accordance with the predetermined strategy.

The second order PLL (417), FIG. 4, includes a phase-error detector (418), three multiplication units (420, 424, 430) three delay units (422, 428, 434), and three summing units (426, 432, 436). The phase-error detector (418), a phase-detector error summer, is operably coupled to receive an input signal and a feedback signal of the PLL, and substantially determines a phase difference between the input signal and the feedback signal. In this exemplary implementation, the phase-error detector (418) provides an output signal representing the PLL error (commonly referred to as the PLL error signal) to the first delay unit (422), which is operably coupled to the first multiplication unit (420) and to the second multiplication unit (424). The second multiplication unit (424) is operably coupled to the first summer (426) that is operably coupled to the third multiplication unit (430). The second delay unit (428) is coupled to provide a feedback signal from the first summer (426) to the first summer (426). The first multiplication unit (420) and the third multiplication unit (430) are operably coupled to the second summer (432). The second summer is operably coupled to the third summer (436) and provides an adjusted PLL output signal. The third summer (436) is coupled to the third delay unit (434) which provides a delayed signal to the third summer (436). The third summer (436) further provides the feedback signal for the second order PLL to the phase-error detector (418). The AD (108) is operably coupled to the first and second multiplication units (420, 424), providing input signal to same representing adjusted C2 and C1 PLL parameters, respectively. C3 is a third PLL parameter that is preselected.

In the exemplary implementation utilizing the present invention, for an N range from 32 to 150 and K=8, if the counter comparator signal is ±8 and the threshold value, ±T, is set to ±8, the AD increments the PLL parameters by one step and causes N to be decremented by 15 (unless N has reached 32—the last decrement possible in this case is 13 due to the value (32) of the lower threshold). Where N=32, N remains 32. Thus, where the PLL error signal has steadily increased or steadily decreased, the PLL parameters are incremented and N is decremented (where N is greater than the 32), causing the PLL to track its input signal at a faster tracking speed. If the counter comparator signal is other than ±8, the PLL parameters are decremented by one step and N is incremented by 1 (where N is less than 150), causing the PLL to track its input signal at a lower tracking speed. Where N=150, N remains 150.

In this exemplary implementation, where two PLL parameters (C1, C2) are adjusted for a second order phase-locked loop, "a" may be set to 8 and "b" may be set to 118, to provide for a faster tracking speed acceleration than deceleration. Hardware typically causes a range limit for the PLL parameters. Thus, C2 will have a maximum value and a minimum value defined by a C2 range. To increase the tracking speed of the PLL, C2 may be adjusted by incrementing C2 by one-eighth of the C2 range. To decrease the tracking speed of the PLL, C2 may be decremented by 1/118 of the range. In both cases, the final value of C2 is limited by the C2 range. After C2 is determined, C1 is determined such that C1 is of a form:

$$C1 = \frac{(C2)^2}{8 * C3},$$

where C3 is a predetermined value.
This provides a slightly overdamped PLL that has a slightly slower speed for a given noise bandwidth and a small over-shoot. This exemplary embodiment allows automatic adjustment of the PLL to improve transient behavior.

Figure 5:
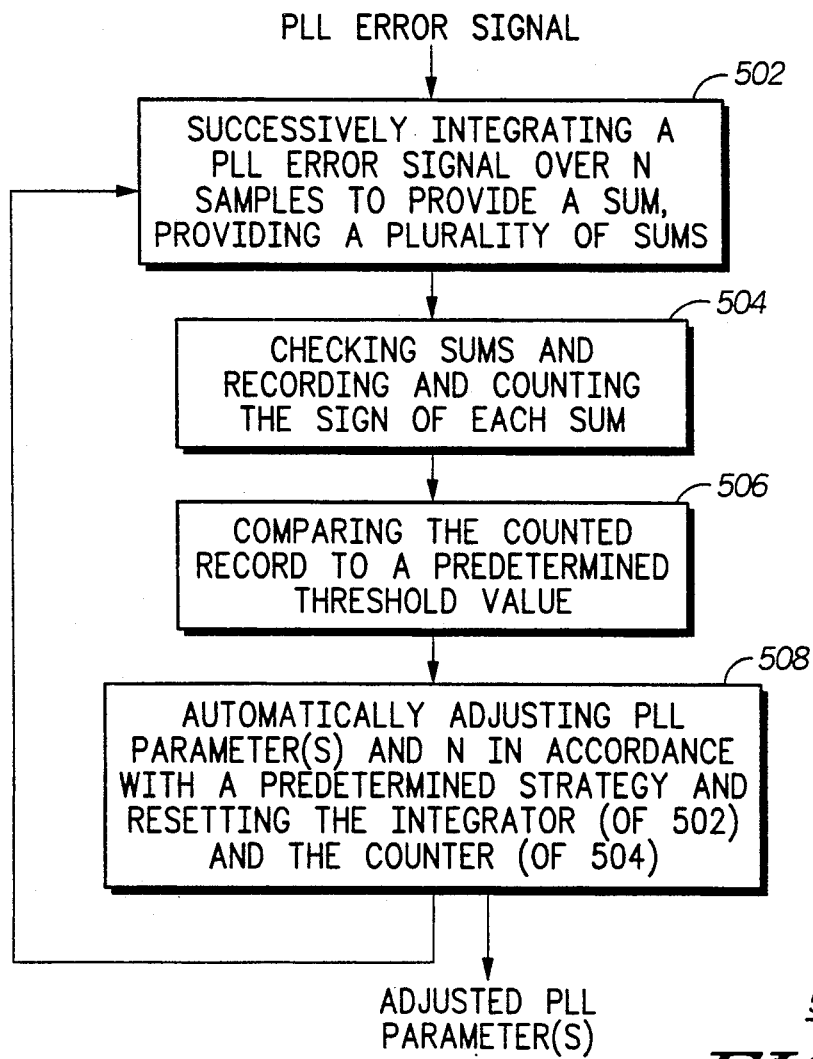
FIG. 5 is a flow chart of the method for automatically adjusting PLL parameters in accordance with the present invention.

FIG. 5, numeral 500, is a flow chart of the method for automatically adjusting parameters of a PLL in accordance with the present invention wherein the PLL has an error output signal. The method comprises the steps of: (1) successively integrating the PLL error output signal over N samples to provide a sum, where N is a first preselected integer, to provide a plurality of sums (502), (2) checking K sums, where K is a second preselected integer, and recording and counting the sign of each sum, (3) comparing the counted record to a predetermined threshold value, and (3) comparing the counted record to a predetermined threshold value, and (4) automatically adjusting PLL parameter(s) and N in accordance with a predetermined strategy based on the comparison, such that adjusted PLL parameters are provided to the PLL. The predetermined strategy typically includes two categories of PLL adjustment. In the first category, where all K sum signals have a same sign and N is greater than a preselected minimum value, the strategy provides a step for causing N to be decremented by a predetermined value, and where a range of PLL parameter adjustment is less than a first predetermined value, the strategy provides a step of adjusting the PLL parameter(s) by an increment step to provide an accelerated PLL tracking speed. In the second category, where the K sum signals have different signs and N is less than a preselected minimum value, the strategy provides a step for causing N to be incremented by a predetermined value, and, where the range of PLL parameter adjustment is greater than a second predetermined value, provides a step for adjusting the PLL parameter(s) by a decrement step to provide a decelerated PLL tracking speed. The increment step and the decrement step are predetermined values that may, for example, be computed as set forth below.

The method may be selected to adjust first and second PLL parameters. Typically, the PLL parameters have a predetermined range. Then, the method may further include the steps of, for incrementing a first PLL parameter by an increment step, incrementing the first PLL parameter by (1/a) times the predetermined range to provide an adjusted first parameter, where a is a first preselected value, and for decrementing the first PLL parameter by a step, decrementing the first PLL parameter by (1/b) times the range to provide an adjusted first parameter, where b is a second preselected value. "a" and "b" may be selected to be different values, thus providing different acceleration and deceleration rate changes for the tracking speed. The method may further include the steps of, for adjusting a second PLL parameter, squaring the value of the adjusted first PLL parameter and dividing the squared value by a third preselected value to provide the adjusted second PLL parameter. The preferred embodiment of the present invention is implementation of the method steps in software using a digital signal processor.

The phase locked-loop (PLL) being adjusted by the above method may be selected to be operably coupled to a voltage-controlled oscillator, for controlling an output of the voltage-controlled oscillator.

Although an exemplary embodiment is described above, it will be obvious to those skilled in the art that many alterations and modifications may be made without departing from the invention. Accordingly, it is intended that all such alterations and modifications be included within the spirit and scope of the invention as defined in the appended claims.

I claim:

1. An automatic phase-locked loop (PLL) parameter adjusting device having a PLL error signal input, comprising:
   (A) integrating means (I), having an I input and an I output, the I input being operably coupled to receive the PLL error signal, for successively integrating the PLL error over a predetermined N sample interval and providing a sum signal at the I output, where N is a first preselected integer, and further being operably coupled to receive an output signal from an automatic decision means, for adjusting N in correspondence with said output signal,
   (B) a counting means (C), having a C input and a C output, being operably coupled to receive the I output signal, for counting K sum signals (where K is a second preselected integer) and recording and counting the sign of said signals to provide a counter comparator signal at the C output,
   (C) a threshold means (TH), having a TH input and a TH output, the TH input being operably coupled to receive the C output (counter comparator) signal, for comparing the C output (counter comparator) signal with a predetermined threshold value to provide a parameter modifications signal at the TH output, and
   (D) the automatic decision means (AD), having an AD input and at least first and second AD outputs, being operably coupled to receive the TH output signal, for:
      (D1) adjusting N in accordance with a predetermined strategy and providing a first AD output signal representing the adjustment of N to the integrating means, and
      (D2) adjusting PLL parameter(s) in accordance with the predetermined strategy and providing AD output signal(s) that represent(s) the adjusted PLL parameter(s), being at least a second AD output signal, to the PLL.

2. The device of claim 1 wherein the integrating means consists of one of:
   (A) a first integrator, operably coupled to receive the PLL error signal, the first integrator comprising a first summer and a first delay means that receives input from an output of the first summer and from a first counter, wherein the first counter is operably coupled to the AD, to the delay means, and to a first switch such that the first counter causes the first switch to close after every N samples are summed to provide the I output signal and increments/decrements N in accordance with an output signal from the AD, and
   (B) a predetermined op-amp, operably coupled to receive the PLL error signal, having a switch and a predetermined capacitor coupled in parallel to an input and an output of the op-amp, the switch being further coupled to the AD for resetting, the output of the op-amp being further coupled to a sample and hold circuit that is coupled to a first timer that periodically receives an output signal from the AD and increments/decrements N in response thereto, such that the sample and hold circuit provides the I output signal.

3. The device of claim 1 wherein the counting means consists of one of:
   (A) a hard-limiting limiter circuit, operably coupled to receive the I output signal, for providing a limiter output signal to a second integrator, a second integrator, operably coupled to receive the limiter output signal, the second integrator comprising a second summer and a second delay means that receives input from an output of the second summer and from a second counter, wherein the second counter is operably coupled to the second delay means and to a second switch such that the second counter causes the second switch to close after every K events to provide the C output signal, and
   (B) a hard-limiting limiter circuit, operably coupled to receive the I output signal, for providing a limiter output signal to a counter that is operably coupled to the TH, such that the counter provides the C output signal after every K events, while the counter is periodically reset by AD.

4. The device of claim 1 wherein the threshold means is a hard-limiting limiter circuit, operably coupled to receive the C output signal, that provides a predetermined threshold value, $\pm T$, for comparison with the counter comparison signal.

5. The device of claim 1 wherein the predetermined strategy provides for:
   (A) where the counter comparator signal is greater than or equal to a predetermined threshold value and N is greater than a preselected minimum value, the AD:
      (A1) provides an output AD signal to the integrating means for decrementing N by 1/c times a range of N, where c is a predetermined value and the range of N is predetermined, and
      (A2) where a range of PLL parameter adjustment is less than a predetermined value, adjusts the PLL parameter(s) by a increment step to provide an accelerated PLL tracking speed, and
   (B) where the counter comparator signal is less than the predetermined value and N is less than a preselected minimum value, the AD:
      (B1) provides an output AD signal to the integrating means for incrementing N by 1/d times the range of N, where d is a predetermined value and the range of N is predetermined, and
      (B2) where the range of PLL parameter adjustment is greater than a predetermined value, adjusts the PLL parameter(s) by a decrement step to provide a decelerated PLL tracking speed.

6. The device of claim 5 the AD further including:
   wherein a first PLL parameter is adjusted:
   (A) for the increment step of (A2), means for incrementing the first PLL parameter by (1/a) times the range to provide an adjusted first parameter, where a is a first preselected value,
   (B) for the decrement step of (B2), means for decrementing the first PLL parameter by (1/b) times the range to provide an adjusted first parameter, where b is a second preselected value, and
   wherein a second PLL parameter is adjusted:
   means for squaring the value of the adjusted first PLL parameter and means for dividing the squared value by a third preselected value to provide the adjusted second PLL parameter.

7. The device of claim 6 wherein at least one of the following relationships is selected:
   (A) a is different from b; and
   (B) c is different from d.

8. The device of claim 1 further including a phase locked-loop (PLL), operably coupled to receive an input signal, for providing the PLL error signal and for utilizing at least a AD output signal(s) that represent(s) the adjusted PLL parameter(s).

9. A system for regulating a voltage-controlled oscillator with an automatically adjusted phase-locked loop (PLL), the PLL having an input signal, comprising:
   (A) a PLL, having at least first and second PLL inputs and at least first and second PLL outputs, operably coupled to receive the input signal at the first PLL input, for providing a PLL error signal to an automatic PLL parameter adjusting unit as a first PLL output signal, receiving and utilizing adjusted PLL parameter(s) to provide an adjusted PLL signal to a voltage-controlled oscillator (VCO) means at the second PLL output.
   (B) the automatic PLL parameter adjusting unit (APA), having predetermined PLL parameters and having a first APA input and at least a first APA output, operably coupled to receive the PLL error signal at the first APA input, for automatically adjusting the predetermined PLL parameters in accordance with a predetermined strategy and providing signal(s) representing the adjusted PLL parameter(s) at APA output(s) that are operably coupled to PLL input(s), and
   (C) the voltage-controlled oscillator (VCO) means, having at least a first VCO input and a first VCO output, operably coupled to receive the adjusted PLL signal at the first VCO input, for tuning the VCO in accordance with a predetermined scheme to provide the first VCO output signal, wherein the automatic phase-locked loop (PLL) parameter adjusting unit that utilizes a PLL error signal, comprises:
   (A) integrating means (I), having an I input and an I output, the I input being operably coupled to receive the PLL error signal, for successively integrating the PLL error for a predetermined N sample interval and providing a sum signal at the I output, where N is a first preselected integer,
   (B) a counting means (C), having a C input and a C output, being operably coupled to receive the I output signal, for counting K sum signals (where K is a second preselected integer) and recording and counting the sign of said signals to provide a counter comparator signal at the C output,
   (C) a threshold means (TH), having a TH input and a TH output, the TH input being operably coupled to receive the C output (counter comparator) signal, for comparing the C output (counter comparator) signal with a predetermined threshold value to provide a parameter modification signal at the TH output, and
   (D) an automatic decision means (AD), having a AD input and at least first and second AD outputs, being operably coupled to receive the TH output signal, for:
      (D1) adjusting N in accordance with a predetermined strategy and providing a first AD output signal representing the adjustment of N to the integrating means, and
      (D2) adjusting PLL parameter(s) in accordance with the predetermined strategy and providing AD output signal(s) that represent(s) the adjusted PLL parameter(s), being at least a second AD output signal, to the PLL.

10. The system of claim 9 wherein the integrating means consists of one of:
   (A) a first integrator, operably coupled to receive the PLL error signal, the first integrator comprising a first summer and a first delay means that receives input from an output of the first summer and from a first counter, wherein the first counter is operably coupled to the AD, to the delay means, and to a first switch such that the first counter causes the first switch to close after every N samples are summed to provide the I output signal and increments/decrements N in accordance with an output signal from the AD, and
   (B) a predetermined op-amp, operably coupled to receive the PLL error signal, having a switch and a predetermined capacitor coupled in parallel to an input and an output of the op-amp, the switch being further coupled to the AD for resetting, the output of the op-amp being further coupled to a sample and hold circuit that is coupled to a first timer that periodically receives an output signal from the AD and increments/decrements N in response thereto, such that the sample and hold circuit provides the I output signal.

11. The system of claim 9 wherein the counting means consists of one of:
   (A) a hard-limiting limiter circuit, operably coupled to receive the I output signal, for providing a limiter output signal to a second integrator, a second integrator, operably coupled to receive the limiter output signal, the second integrator comprising a second summer and a second delay means that receives input from an output of the second summer and from a second counter, wherein the second counter is operably coupled to the second delay means and to a second switch such that the second counter causes the second switch to close after every K events to provide the C output signal, and
   (B) a hard-limiting limiter circuit, operably coupled to receive the I output signal, for providing a limiter output signal to a counter that is operably coupled to the TH, such that the counter provides the C output signal after every K events, while the counter is periodically reset by AD.

12. The system of claim 9 wherein the threshold means is a hard-limiting limiter circuit, operably coupled to receive the C output signal, that provides a predetermined threshold value, $\pm T$, for comparison with the counter comparison signal.

13. The system of claim 9 wherein the predetermined strategy provides for:
   (A) where the counter comparator signal is greater than or equal to a predetermined threshold value and N is greater than a preselected minimum value, the AD:
      (A1) provides an output AD signal to the integrating means for decrementing N by $1/c$ times a range of N, where c is a predetermined value and the range of N is predetermined, and
      (A2) where a range of PLL parameter adjustment is less than a predetermined value, adjusts the PLL parameter(s) by a increment step to provide an accelerated PLL tracking speed, and
   (B) where the counter comparator signal is less than the predetermined threshold value and N is less than a preselected minimum value, the AD:

(B1) provides an output AD signal to the integrating means for incrementing N by 1/d times a range of N, where d is a predetermined value and the range of N is predetermined, and (B2) where the range of PLL parameter adjustment is greater than a predetermined value, adjusts the PLL parameter(s) by a decrement step to provide a decelerated PLL tracking speed.

14. The system of claim 13 wherein the AD further includes:

wherein a first PLL parameter is adjusted:

(A) for the increment step of (A2), means for incrementing the first PLL parameter by (1/a) times the range to provide an adjusted first parameter, where a is a first preselected value, (B) for the decrement step of (B2), means for decrementing the first PLL parameter by (1/b) times the range to provide an adjusted first parameter, where b is a second preselected value, and wherein a second PLL parameter is adjusted:

means for squaring the value of the adjusted first PLL parameter and means for dividing the squared value by a third preselected value to provide the adjusted second PLL parameter.

15. The system of claim 14 wherein at least one of the following relationships is selected:

(A) a is different from b; and (B) c is different from d.

16. A method for automatically adjusting parameters of a phase-locked loop (PLL) that has a PLL error output signal, comprising the steps of:

(A) successively integrating the PLL error output signal over N samples to provide a sum, where N, is a first preselected integer, to provide a plurality of sums, (B) checking K sums, where K is a second preselected integer, and recording and counting the sign of each sum, (C) comparing the counted record to a predetermined threshold value, and (D) automatically adjusting PLL parameter(s) and N in accordance with a predetermined strategy based on the comparison, such that adjusted PLL parameters are provided to the PLL.

17. The method of claim 16 wherein the predetermined strategy includes the steps of:

(A) where the counter comparator signal is greater than or equal to a predetermined threshold value and N is greater than a preselected minimum value:

(A1) causing N to be decremented by 1/c times a range of N, where c is a predetermined value and the range of N is predetermined, and (A2) where a range of PLL parameter adjustment is less than a predetermined value, adjusting the PLL parameter(s) by a increment step to provide an accelerated PLL tracking speed, and (B) where the counter comparator signal is less than the predetermined threshold value and N is less than a preselected minimum value:

(B1) causing N to be incremented by 1/d times a range of N, where d is a predetermined value and the range of N is predetermined, and (B2) where the range of PLL parameter adjustment is greater than a predetermined value, adjusting the PLL parameter(s) by a decrement step to provide a decelerated PLL tracking speed.

18. The method of claim 17 further including the steps of:

for adjusting a first PLL parameter:

(A) for an increment step of (A2), incrementing the first PLL parameter by (1/a) times the range to provide an adjusted first parameter, where a is a first preselected value, (B) for a decrement step of (B2), decrementing the first PLL parameter by (1/b) times the range to provide an adjusted first parameter, where b is a second preselected value, and for adjusting a second PLL parameter:

squaring the value of the adjusted first PLL parameter and dividing the squared value by a third preselected value to provide the adjusted second PLL parameter.

19. The method of claim 18 wherein at least one of the following relationships is selected:

(A) a is different from b; and (B) c is different from d.

20. The method of claim 16 wherein the phase locked-loop (PLL) being adjusted is operably coupled to a voltage-controlled oscillator, for controlling the output of the voltage-controlled oscillator.

* * * * *

UNITED STATES PATENT AND TRADEMARK OFFICE
CERTIFICATE OF CORRECTION

PATENT NO. : 5,268,655

DATED : Dec. 7, 1993

INVENTOR(S) : Ping Dong

It is certified that error appears in the above-identified patent and that said Letters Patent is hereby corrected as shown below:

At column 9, line 28, "parameter modifications" should be --parameter modification--.

Signed and Sealed this

Thirty-first Day of May, 1994

Attest:

BRUCE LEHMAN

*Attesting Officer*     *Commissioner of Patents and Trademarks*